(12) United States Patent
Kadoya

(10) Patent No.: US 10,468,347 B2
(45) Date of Patent: Nov. 5, 2019

(54) SEMICONDUCTOR DEVICE INCLUDING FULLY-SILICIDED LINER EXTENDING OVER A CONTACT PLUG AND INSULATING LAYER

(71) Applicant: Micron Technology, Inc., Boise, ID (US)

(72) Inventor: Tomohiro Kadoya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/660,759

(22) Filed: Mar. 17, 2015

(65) Prior Publication Data

US 2015/0294934 A1 Oct. 15, 2015

(30) Foreign Application Priority Data

Apr. 11, 2014 (JP) ................. 2014-081797

(51) Int. Cl.
| | |
|---|---|
| *H01L 23/52* | (2006.01) |
| *H01L 27/10* | (2006.01) |
| *H01L 23/528* | (2006.01) |
| *H01L 27/108* | (2006.01) |

(52) U.S. Cl.
CPC ...... *H01L 23/528* (2013.01); *H01L 27/10811* (2013.01); *H01L 27/10817* (2013.01); *H01L 27/10823* (2013.01); *H01L 27/10855* (2013.01); *H01L 27/10876* (2013.01); *H01L 27/10885* (2013.01); *H01L 27/10891* (2013.01); *H01L 27/10894* (2013.01); *H01L 2924/0002* (2013.01)

(58) Field of Classification Search
CPC .. H01L 23/528; H01L 28/40; H01L 27/10847
USPC ........................................ 257/368; 438/199
See application file for complete search history.

(56) References Cited

U.S. PATENT DOCUMENTS

| | | | | |
|---|---|---|---|---|
| 5,804,862 A | * | 9/1998 | Matumoto | H01L 21/76224 257/382 |
| 2003/0003720 A1 | * | 1/2003 | Jin | H01L 21/76834 438/648 |
| 2007/0032022 A1 | * | 2/2007 | Min | H01L 27/11253 438/275 |
| 2010/0012996 A1 | * | 1/2010 | Lin | H01L 27/10855 257/306 |
| 2010/0181671 A1 | * | 7/2010 | Park | H01L 21/28562 257/751 |
| 2011/0037111 A1 | * | 2/2011 | Kim | H01L 27/10885 257/302 |
| 2011/0092060 A1 | * | 4/2011 | Lee | H01L 21/76831 438/586 |
| 2011/0241102 A1 | * | 10/2011 | Cho | H01L 27/10888 257/329 |

(Continued)

FOREIGN PATENT DOCUMENTS

| | | |
|---|---|---|
| JP | 07-058058 | 3/1995 |
| JP | 2012-099793 | 5/2012 |

*Primary Examiner* — Didarul A Mazumder
(74) *Attorney, Agent, or Firm* — Wells St. John P.S.

(57) ABSTRACT

Disclosed herein is a device that includes a substrate, a contact plug disposed on the substrate, an interlayer dielectric over the substrate to define the contact plug, a titanium silicide extending continuously from an upper portion of the contact plug to over the interlayer dielectric, a conductive material disposed over the titanium silicide.

10 Claims, 23 Drawing Sheets

(56) References Cited

U.S. PATENT DOCUMENTS

| | | | |
|---|---|---|---|
| 2012/0086084 A1* | 4/2012 | Kikuchi | H01L 21/823842 257/369 |
| 2012/0161324 A1* | 6/2012 | Heinrich | H01L 21/28518 257/757 |
| 2013/0056823 A1* | 3/2013 | Kim | H01L 27/10885 257/334 |
| 2013/0256904 A1* | 10/2013 | Im | H01L 27/10885 257/774 |
| 2013/0292847 A1* | 11/2013 | Choi | H01L 23/498 257/774 |
| 2014/0061939 A1* | 3/2014 | Yu | H01L 21/76879 257/774 |
| 2014/0179092 A1* | 6/2014 | Kim | H01L 27/10888 438/586 |

* cited by examiner

SEMICONDUCTOR DEVICE INCLUDING FULLY-SILICIDED LINER EXTENDING OVER A CONTACT PLUG AND INSULATING LAYER

RELATED PATENT DATA

This application is based upon and claims the benefit of priority from Japanese Patent Application No. 2014-081797 filed on Apr. 11, 2014, the disclosure of which is incorporated herein in its entirely by reference.

TECHNICAL FIELD

Field of the Invention

In a DRAM (Dynamic Random Access Memory) that is a typical semiconductor memory device, its memory cell size needs to be reduced together with a highly integrated configuration and in accordance with the reduction of the memory cell size, the pitch of the bit line also needs to be reduced. In the case of a bit line having a polymetal structure, since the bit line becomes thicker by a portion corresponding to the silicon layer, the bit line capacitance is increased as the pitch of the bit line is reduced. In order to make the bit line thinner, a bit line having a full metal structure without a silicon layer is required (Japanese Patent Application Laid Open No. 1995-058058, Japanese Patent Application Laid Open No. 2012-099793).

Description of Prior Art

In the case of the bit line of the full metal structure, a contact area between a contact plug (bit contact) for use in connecting a bit line to a source/drain region formed on a semiconductor substrate and the bit line is determined by the width of the bit line. For example, in the case when the bit line has a stacked structure between a metal layer (W) and a barrier metal (TiN), with the contact plug being made of silicon, a metal silicide layer is formed on its interface in order to reduce a contact resistance between the barrier metal (TiN) and silicon. As the bit line becomes thinner, the resistance of the bit contact tends to become greater by the reduction of the connection area between TiN and the metal silicide.

SUMMARY

The discloser provides a semiconductor device that includes a substrate, a contact plug disposed on the substrate, an interlayer dielectric over the substrate to define the contact plug, a titanium silicide extending continuously from an upper portion of the contact plug to over the interlayer dielectric, a conductive material disposed over the titanium silicide.

The discloser further provides a semiconductor device that includes a substrate, a titanium silicide disposed over the substrate, wherein the titanium silicide comprises, a first portion being located on a first conductive material that is in contact with the substrate, a second portion being located on an interlayer dielectric that is adjacent to the first conductive material, the first and the second portions extend continuously.

The discloser still further provides a semiconductor device that includes a substrate, a first metal silicide comprising a cup shape including a bottom portion facing to the substrate, an interlayer dielectric surrounding an outer surface of the first metal silicide, a metal material disposed in an inner portion of the cup shape of the first metal silicide, a second metal silicide extending continuously on respective upper portions of the interlayer dielectric, the first metal silicide and the metal material.

DETAILED DESCRIPTION OF THE INVENTION

Preferred embodiments of the present invention will hereinafter be described in detail, referring to the accompanying drawings.

Figure 1:
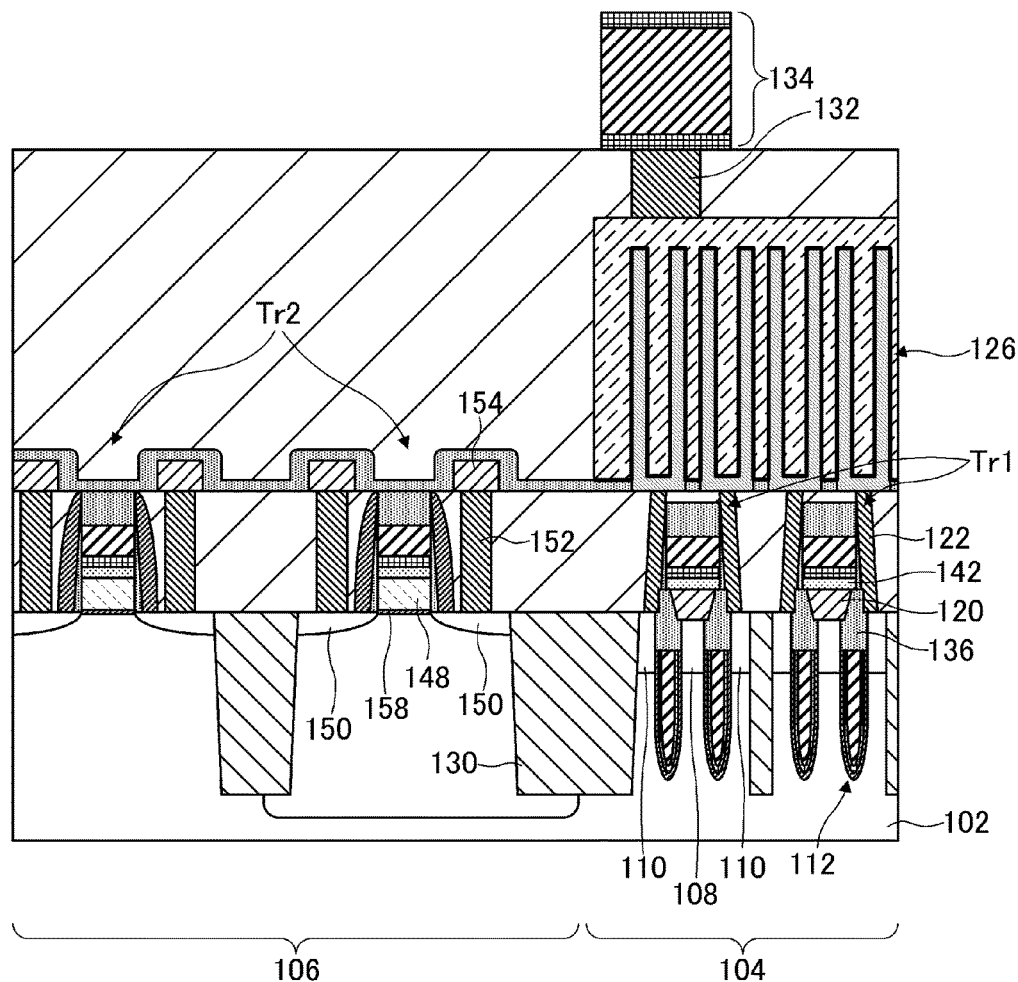
FIG. 1 is a cross-sectional view of a semiconductor device in accordance with an embodiment of the present invention.
Figure 2:
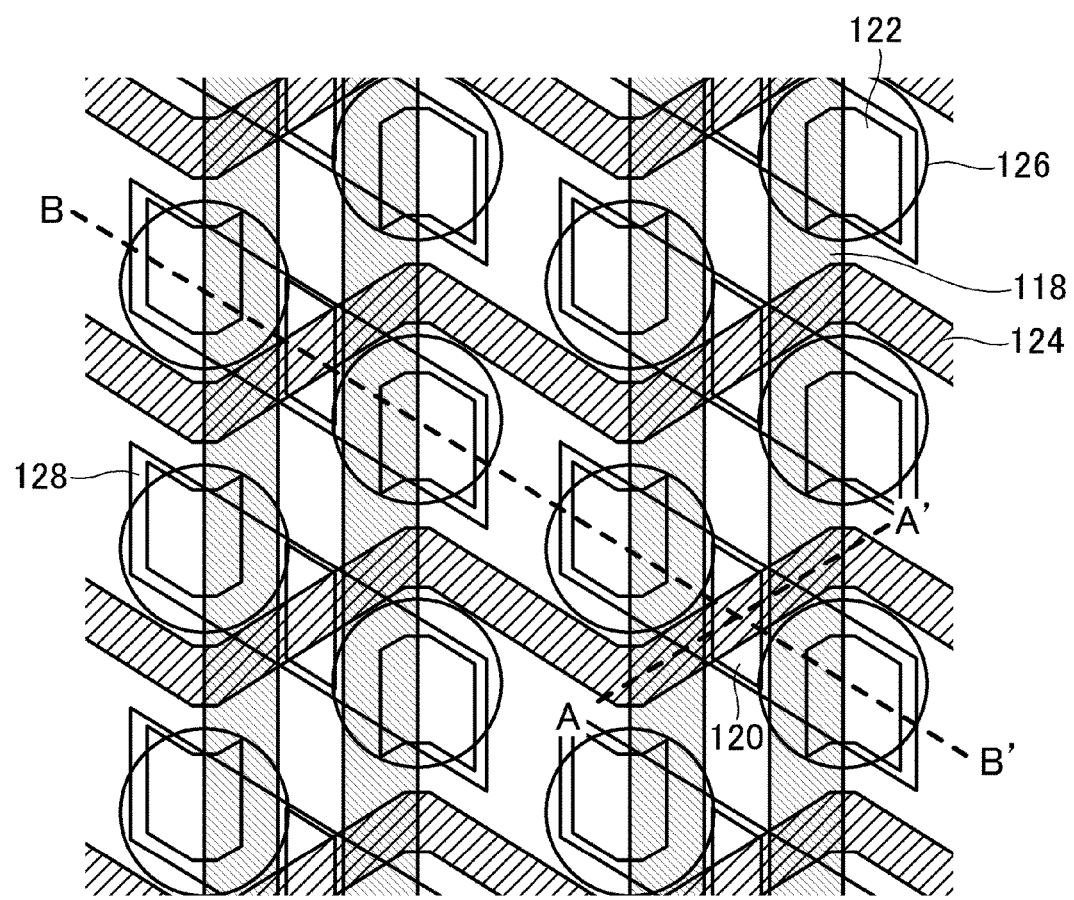
FIG. 2 is a top plan view that shows a configuration of a semiconductor device in a first region.
Figure 3:
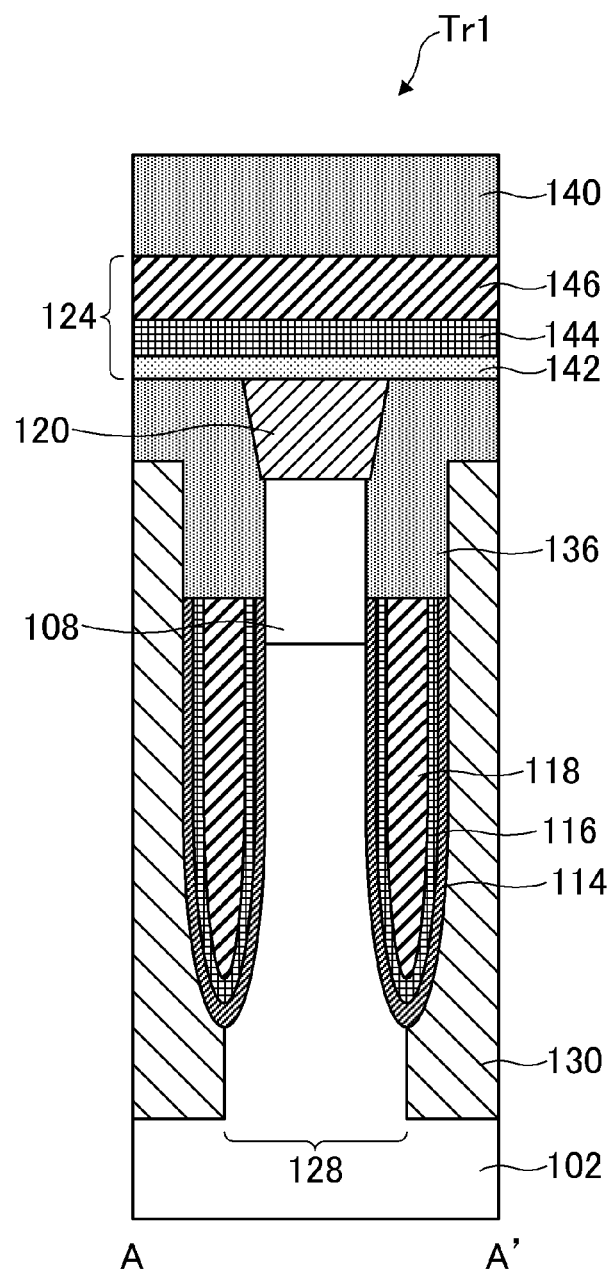
FIG. 3 is an expanded cross-sectional view of the FIG. 2 along the line A-A'.
Figure 4:
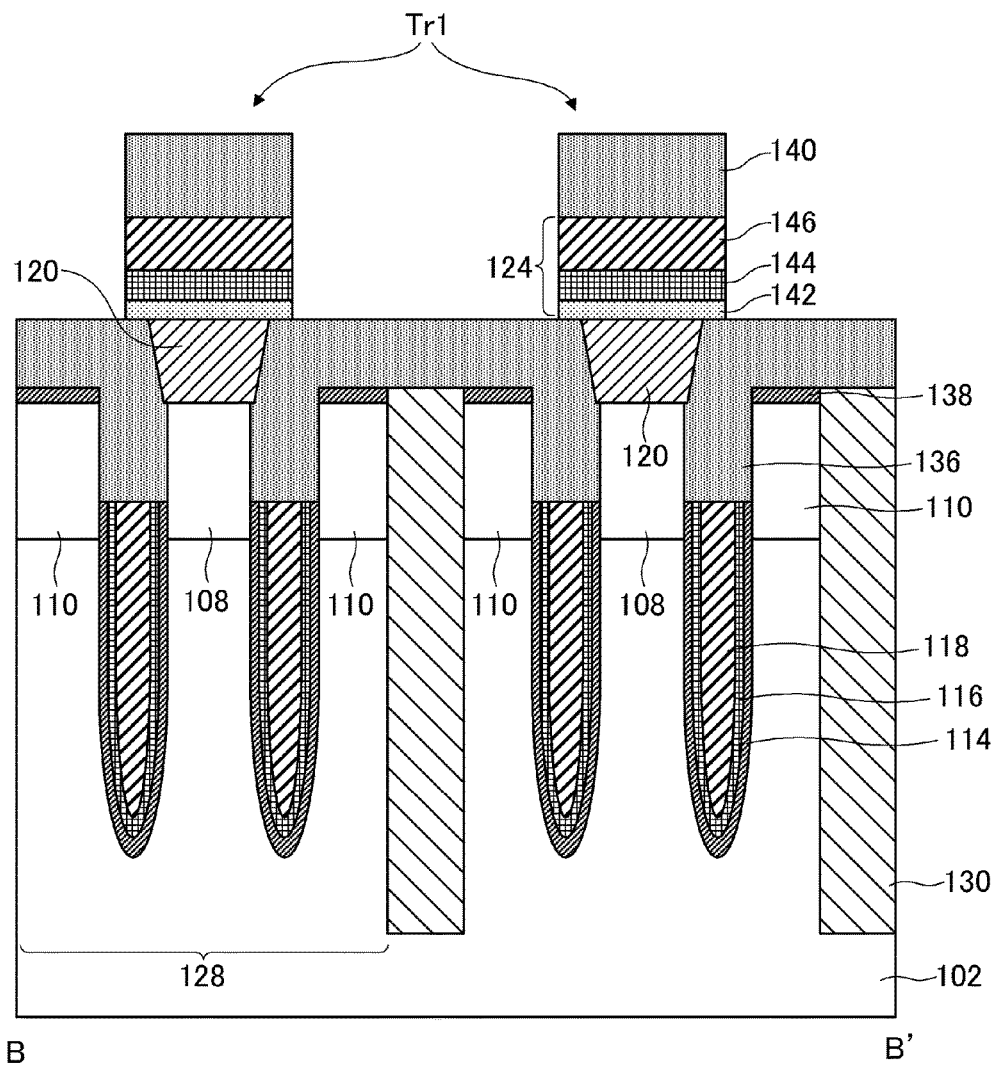
FIG. 4 is an expanded cross-sectional view of the FIG. 2 along the line B-B'.

FIG. 1 is a cross-sectional view showing a semiconductor device 100 in accordance with a first embodiment of the present invention. FIG. 2 is a plan view showing a configuration of a first region 104 of the semiconductor device 100. FIG. 3 is an enlarged cross-sectional view taken along line A-A' of FIG. 2. FIG. 4 is an enlarged cross-sectional view taken along line B-B' of FIG. 2. The semiconductor device 100 of the present embodiment has a memory cell array of a DRAM; however, the present invention is not intended to be limited by the application to the DRAM.

The semiconductor device 100 is formed on a P-type semiconductor substrate 102 that comprises a P-type silicon. A trench-transistor Tr1 is formed in the first region 104, and a planar-transistor Tr2 is formed in a second region 106. The first region 104 of the semiconductor substrate 102 includes a plurality of word line grooves 112 and a first diffusion layer 108 (n-type diffusion layer) formed between the two word line grooves 112 and second diffusion layers 110 (n-type diffusion layers) each formed on the opposite sides of the first diffusion layer 108 the two word line grooves 112, respectively. The first diffusion layer 108 and the second diffusion layer 110 function as source/drain regions. The inner surface of each word line groove 112 is covered with a gate insulating film 114 (SiO) and a barrier metal 116 (TiN), and a word line 118 (W) is formed inside thereof.

A bit contact 120 (contact plug) is formed on the first diffusion layer 108, and a storage contact 122 is formed on the second diffusion layer 110. A bit line 124 is connected to the bit contact 120. Moreover, the bit contact 120 is directly contacted to the first diffusion layer 108. The bit line 124 is disposed in a meandering manner as shown in FIG. 2 so as to be continuously connected to the plural bit contacts 120. A nitride film 140 (SiN), which functions as a hard mask at the time of an etching process, is stacked on the bit line 124. A storage element 126 (cylinder capacitor) is connected to an upper portion of the storage contact 122. The storage element 126 is connected to an upper wiring 134 through a plug 132.

An active region 128 is formed as an elongated island-shaped region with its periphery surrounded by an isolation region 130 (see FIG. 2). The isolation region 130 is formed by filling the isolation grooves on the semiconductor substrate with a field insulating layer (SiO$_2$). The storage contact 122 and the storage element 126 are formed on the both ends of the active region 128. The storage contact 122 has such a shape as not only to cover a region overlapped with the second diffusion layer 110, but also to extend the inner area (over word line 118) of the region. That is, it has an overlapped portion with the word line 118, when seen in a plan view.

A second insulating layer 138 (SiO$_2$) is formed on the surface of the semiconductor substrate 102, and the first insulating layer 136 as an ILD (Inter-Layer Dielectric) is formed so as to cover the upper portion of the word line 118 and the second insulating layer 138 (see FIG. 4). The first insulating layer 136 surrounds the side face of the bit contact 120.

The bit line 124 is formed by stacking a conductive material on a metal silicide layer 142, and the conductive material includes a barrier metal layer 144 and a metal wiring layer 146. The metal silicide layer 142 in the present embodiment is formed by titanium silicide (TiSi$_2$); however, in place of titanium (Ti) or in addition to titanium, cobalt, nickel, platinum or the like may be contained therein. The barrier metal layer 144 is formed by titanium nitride (TiN) or tungsten nitride (WN), and the metal wiring layer 146 is formed by tungsten (W).

In the second region 106, the bit line 124 is formed, so as to continuously extend, on each of the semiconductor substrate 102, the gate insulating film 158 and the silicon layer 148 (gate electrode). Moreover, a third diffusion layers 150 (source/drain regions) are formed on the semiconductor substrate 102. The third diffusion layer 150 is connected to an upper portion wiring layer 154, with the contact plug 152 interposed therebetween.

As shown in FIGS. 3 and 4, the metal silicide layer 142 is formed as the lower layer of the bit line 124 in the present embodiment. The metal silicide layer 142 is not only made in contact with the bit contact 120, but also made in contact with a first insulating layer 136 formed on the periphery of the bit contact 120. In this manner, the bit contact 120 is connected to a metal silicide layer 142 having an area larger than the contact plug itself forming the bit contact 120. In the semiconductor substrate 102, the metal silicide layer 142 is made in contact not only with a portion (first portion) to be connected to the bit contact 120 (first conductor), but also with a portion (second portion) to be made in contact with the first insulating layer 136 (see FIG. 3). For this reason, since it becomes possible to sufficiently ensure the contact area between the barrier metal 116 forming the bit line 124 and the metal silicide layer 142 on the bit contact 120, the contact resistance between the two members can be made smaller.

In the planar-transistor Tr2 formed in the second region 106, the silicon layer 148 forming the gate electrode is opposed to the semiconductor substrate 102, with the gate insulating film 158 interposed therebetween. In the planar-transistor Tr2, the metal silicide layer 142 is disposed on the gate insulating film 158 covering the semiconductor substrate 102 and the silicon layer 148 (second conductor) disposed on an upper portion thereof (third portion).

The following description will explain a method for fabricating the semiconductor device 100 in accordance with the present embodiment.

Figure 5:
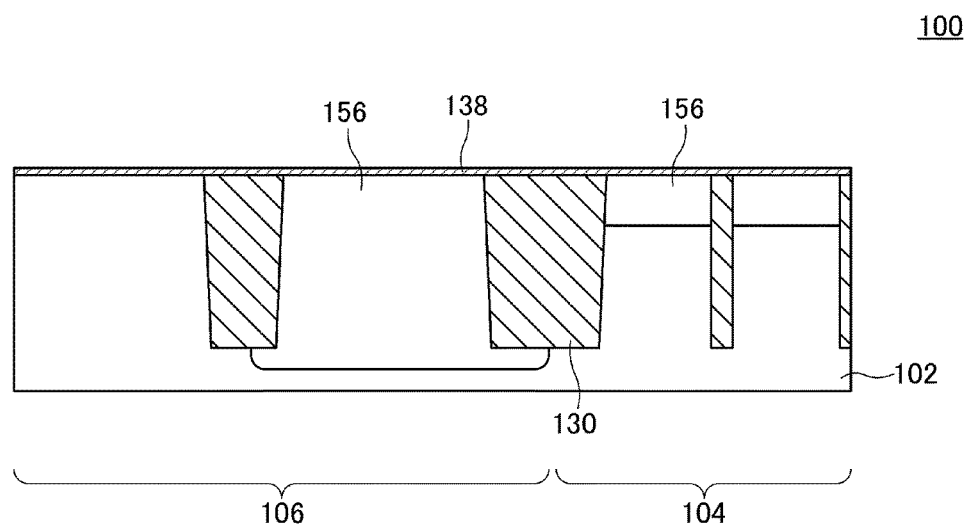
FIG. 5 is a cross-sectional view of an intermediate fabrication process step (1st step) of the semiconductor device shown in FIG. 1.

First, as conventionally known, on the entire surface of the semiconductor substrate 102, a second insulating layer 138 (first insulating layer) is formed by using a CVD method. Then, isolation grooves are formed on the semiconductor substrate 102, and by filling silicon oxide (SiO$_2$) in the grooves, an isolation region 130 is formed (FIG. 5). Moreover, by further implanting phosphorus with high energy thereto, an n-well 156 (diffusion region) is formed.

Figure 6:
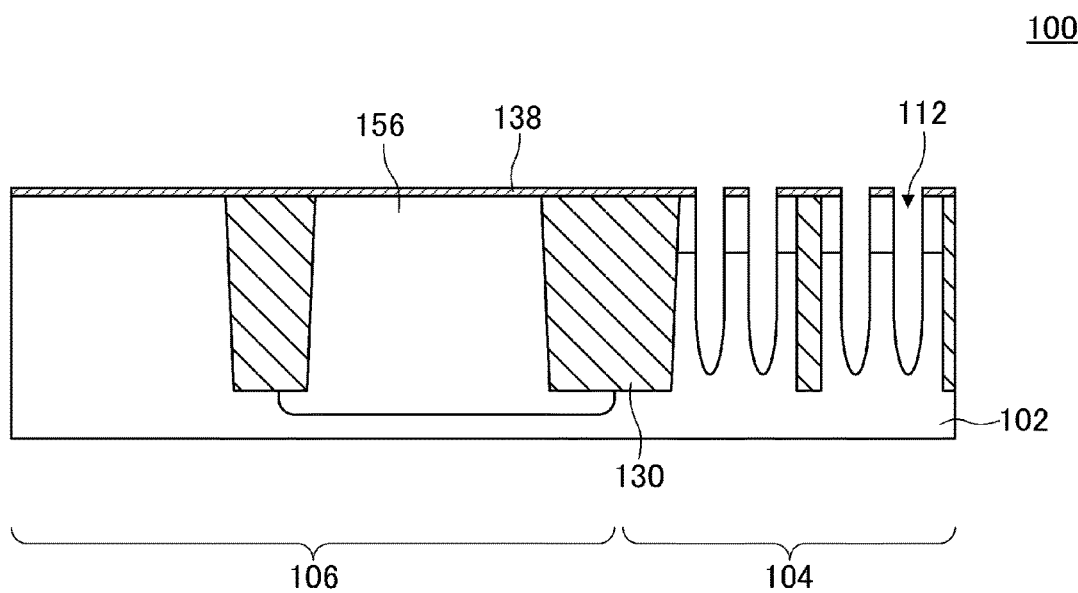
FIG. 6 is a cross-sectional view of an intermediate fabrication process step (2nd step) of the semiconductor device shown in FIG. 1.
Figure 7:
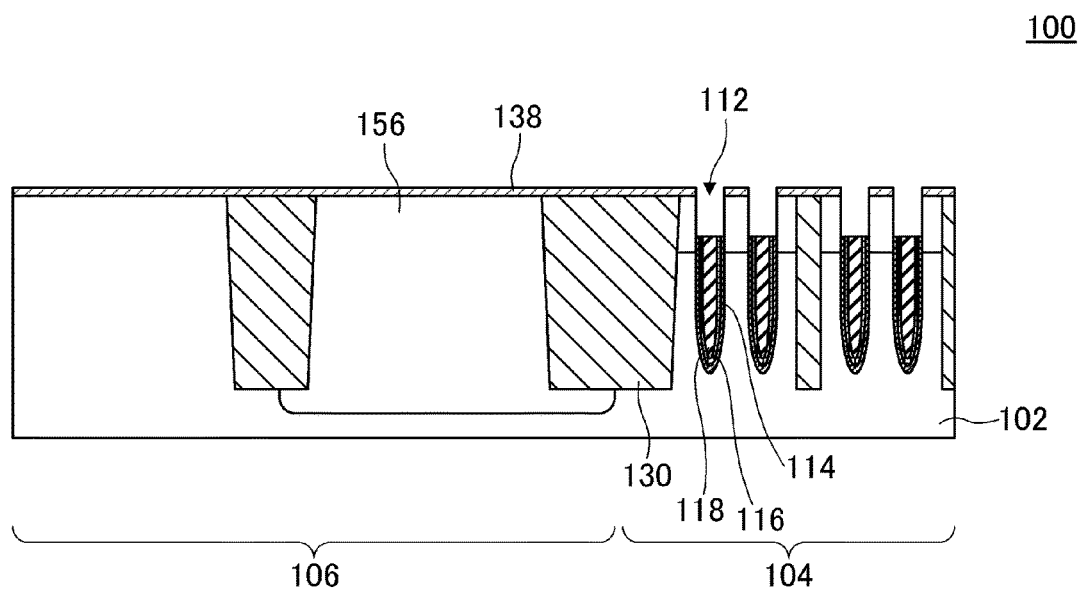
FIG. 7 is a cross-sectional view of an intermediate fabrication process step (3rd step) of the semiconductor device shown in FIG. 1.

Next, in order to form a word line 118, first, a word line groove 112 is formed by etching the semiconductor substrate 102 (FIG. 6). A gate insulating film 114 is formed on the inner side face of the word line groove 112 by using a thermal oxidizing method, a CVD method or an ALD method, then a barrier metal 116 (TiN) is further formed thereon, and the word line 118 (W) is then buried in the word line groove 112 (FIG. 7). The word line 118 is recessed by employing an etchback process so as to make the upper surface of the word line 118 lower than the upper surface of the semiconductor substrate 102.

Figure 8:
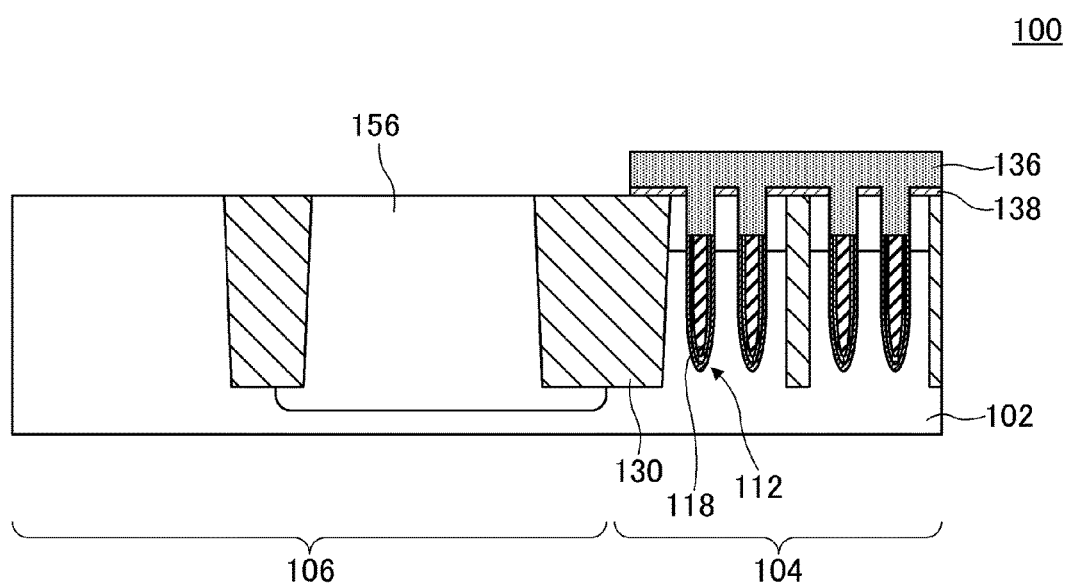
FIG. 8 is a cross-sectional view of an intermediate fabrication process step (4th step) of the semiconductor device shown in FIG. 1.

Next, the upper portion of the word line groove 112 is buried by depositing the first insulating layer 136 (FIG. 8). The first insulating film 136 may be formed as a silicon nitride film of a single layer, or may be formed as a stacked film composed of a silicon nitride film by an LPCVD method and a silicon nitride film by an ALD (Atomic Layer Deposition) method. Moreover, the second insulating film 138 is removed from the second region 106 by a wet etching process or the like. Thus, the surface of the semiconductor substrate 102 is exposed in the second region 106.

Figure 9:
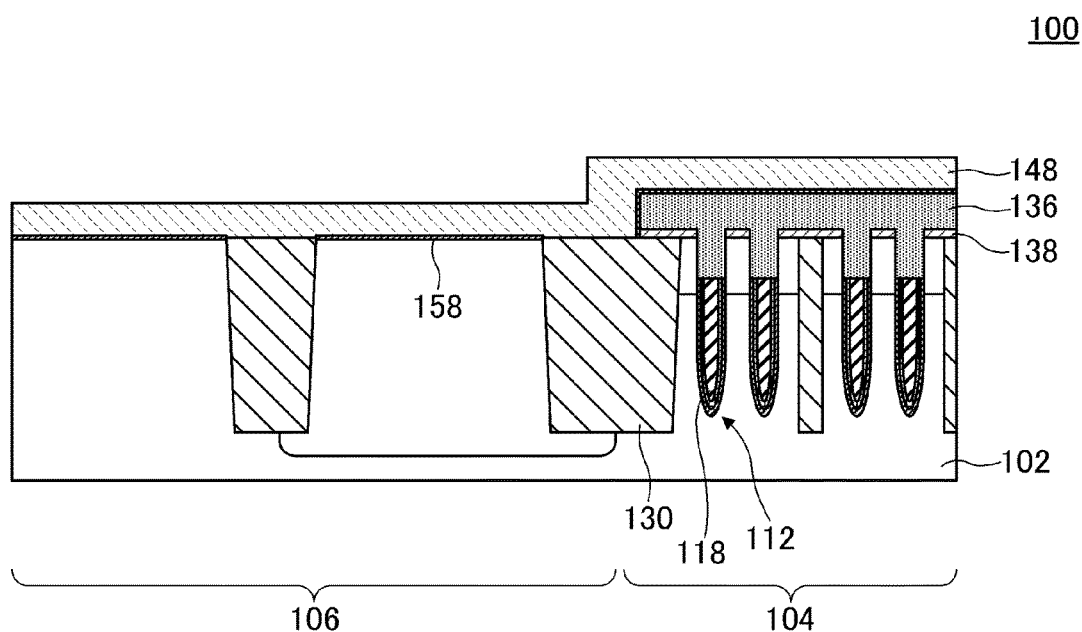
FIG. 9 is a cross-sectional view of an intermediate fabrication process step (5th step) of the semiconductor device shown in FIG. 1.

Next, a gate insulating film 158 is formed by using, for example, thermal oxidation (FIG. 9). Thereafter, a silicon layer 148 (second conductor) is formed on the entire surface of the semiconductor substrate 102 by using a CVD process.

Figure 10:
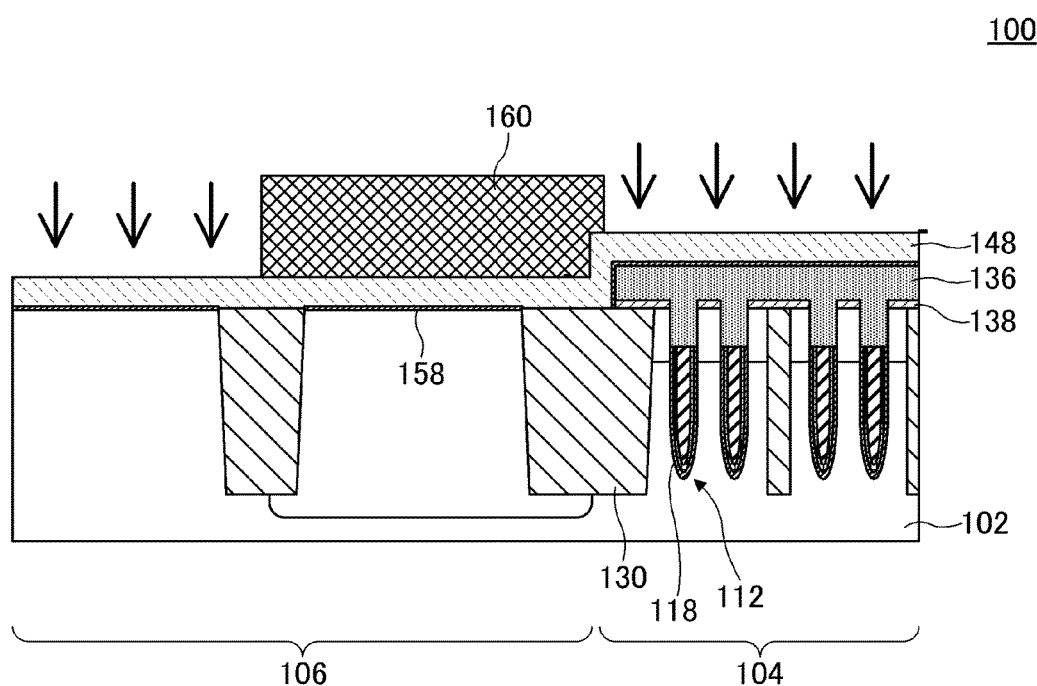
FIG. 10 is a cross-sectional view of an intermediate fabrication process step (6th step) of the semiconductor device shown in FIG. 1.
Figure 11:
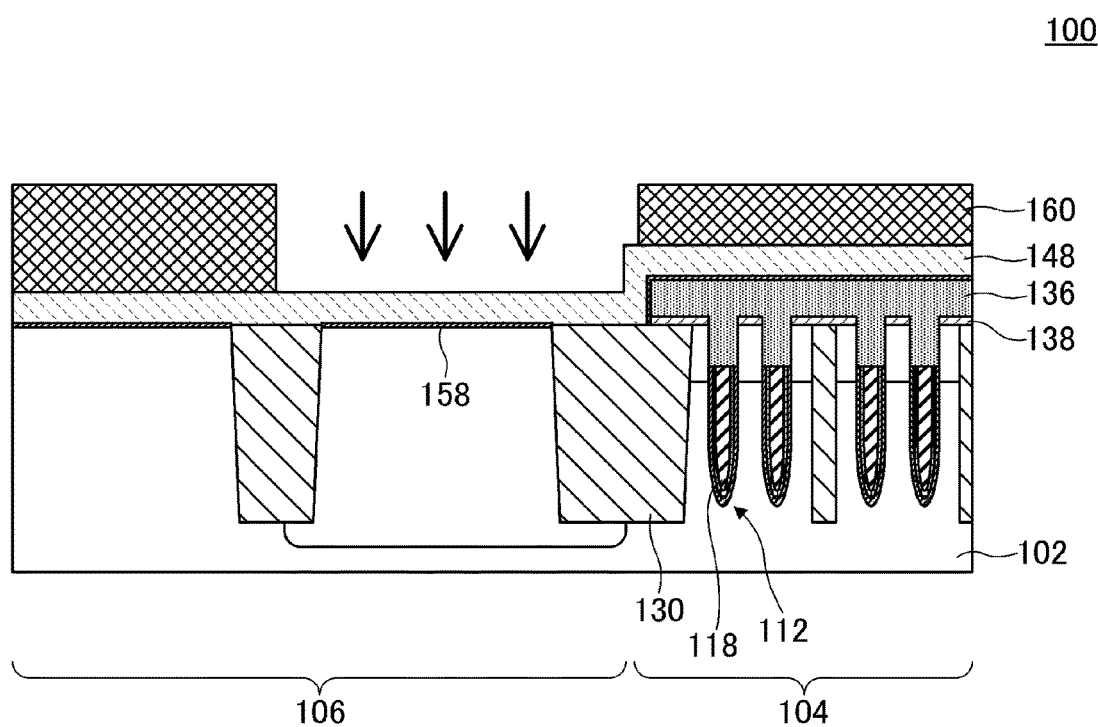
FIG. 11 is a cross-sectional view of an intermediate fabrication process step (7th step) of the semiconductor device shown in FIG. 1.

Successively, phosphorus is shallowly implanted to the silicon layer 148 on the n-channel region with a low energy, with a p-channel transistor formation region in the second region 106 being covered with resist 160 (FIG. 10). Moreover, boron is shallowly implanted to the silicon layer 148 on the p-channel region with a low energy, with an area except the p-channel transistor formation region in the second region 106 being covered with the resist 160 (FIG. 11).

Figure 12:
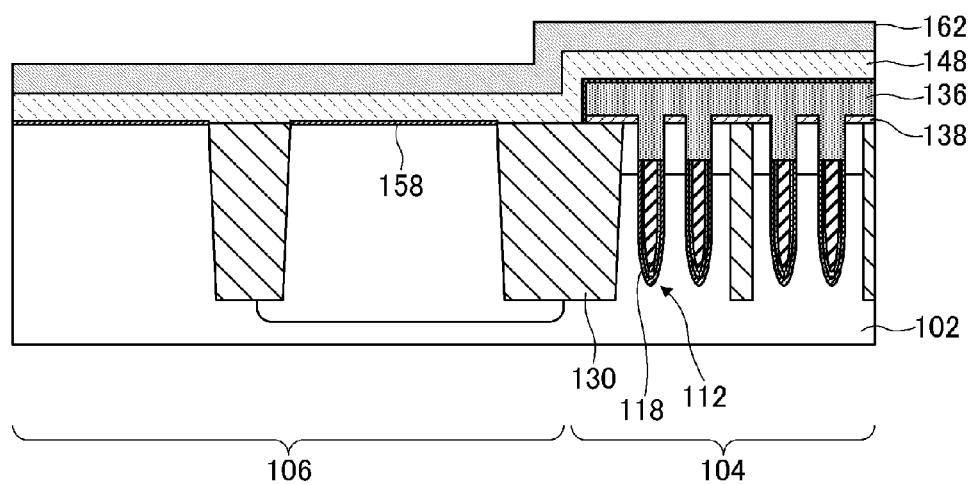
FIG. 12 is a cross-sectional view of an intermediate fabrication process step (8th step) of the semiconductor device shown in FIG. 1.
Figure 13:
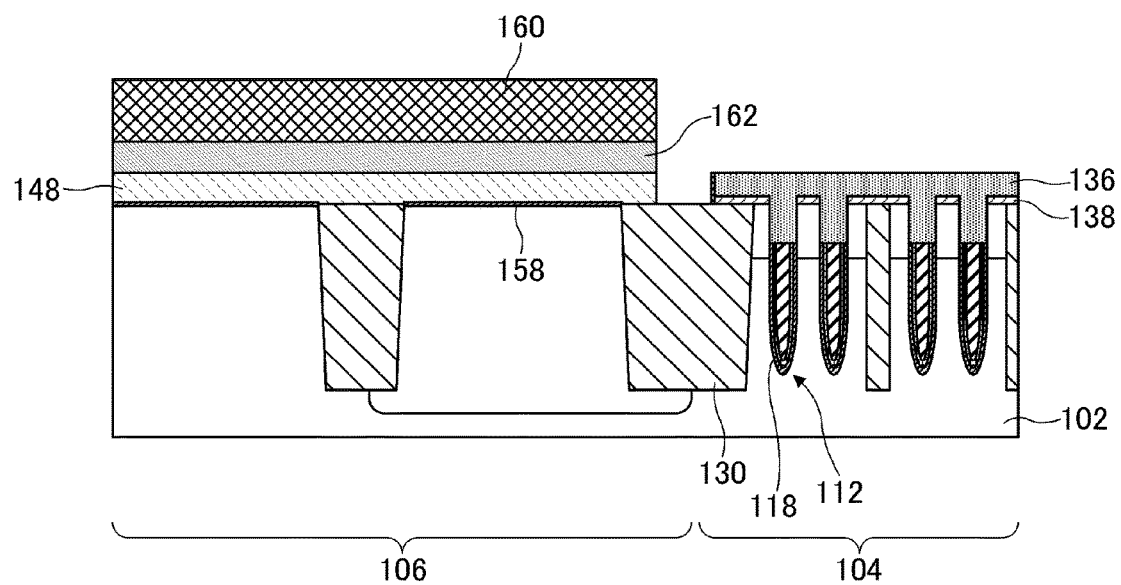
FIG. 13 is a cross-sectional view of an intermediate fabrication process step (9th step) of the semiconductor device shown in FIG. 1.

Next, a cap insulating film 162 ($SiO_2$) is formed on the amorphous silicon layer 148 by a plasma CVD method (FIG. 12). With the second region 106 being covered with the resist 160, the amorphous silicon layer 148 and the cap insulating film 162 in the first region 104 are removed from the first region 104 by etching (FIG. 13).

Figure 14:
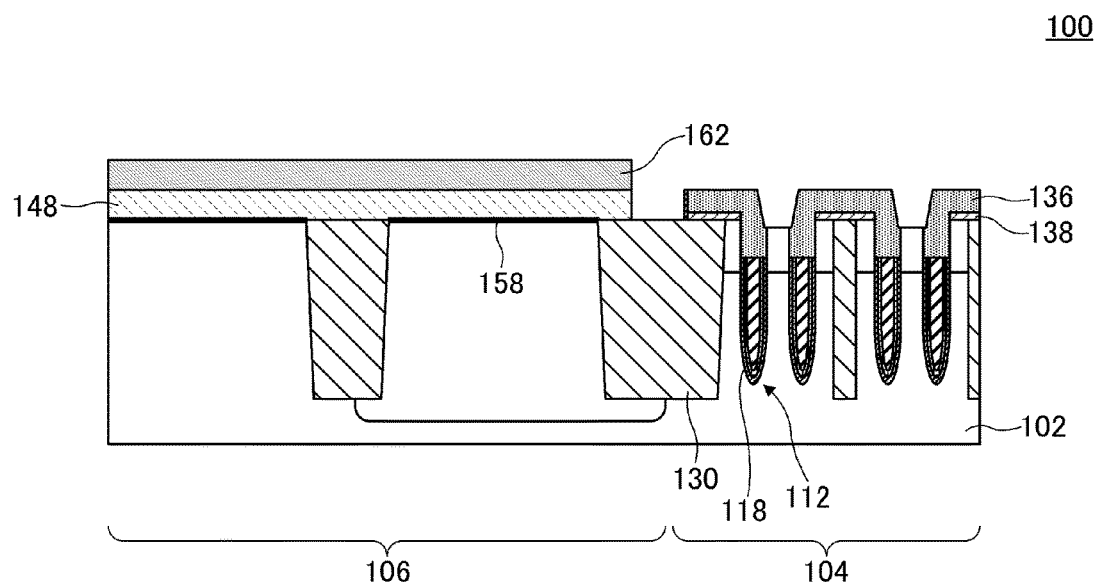
FIG. 14 is a cross-sectional view of an intermediate fabrication process step (10th step) of the semiconductor device shown in FIG. 1.
Figure 15:
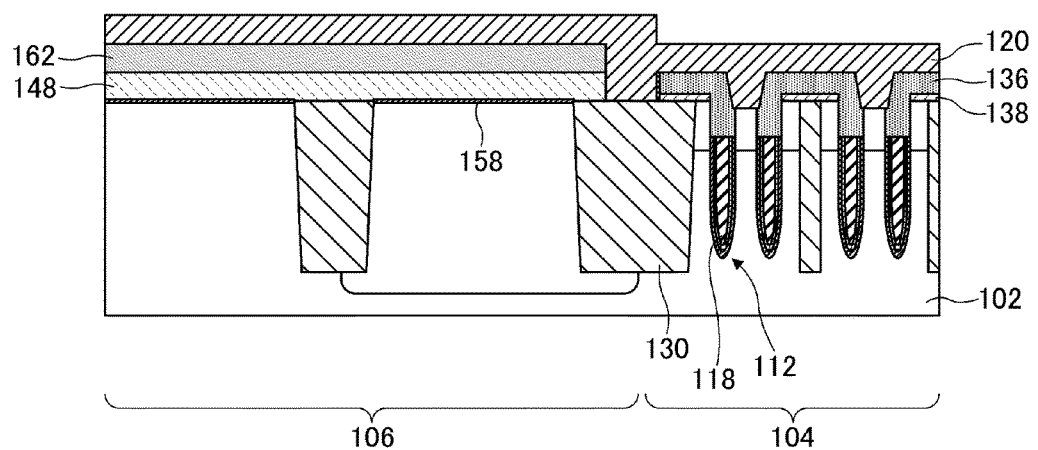
FIG. 15 is a cross-sectional view of an intermediate fabrication process step (11th step) of the semiconductor device shown in FIG. 1.

Successively, by a dry etching process using a bit line contact mask, the first insulating layer 136 is selectively etched so that an opening for the bit contact 120 is formed (FIG. 14). Next, a silicon film (bit contact 120: first conductor) is formed on the entire surface of the semiconductor substrate 102 by a CVD process (FIG. 15). This silicon film is doped with phosphorus.

Figure 16:
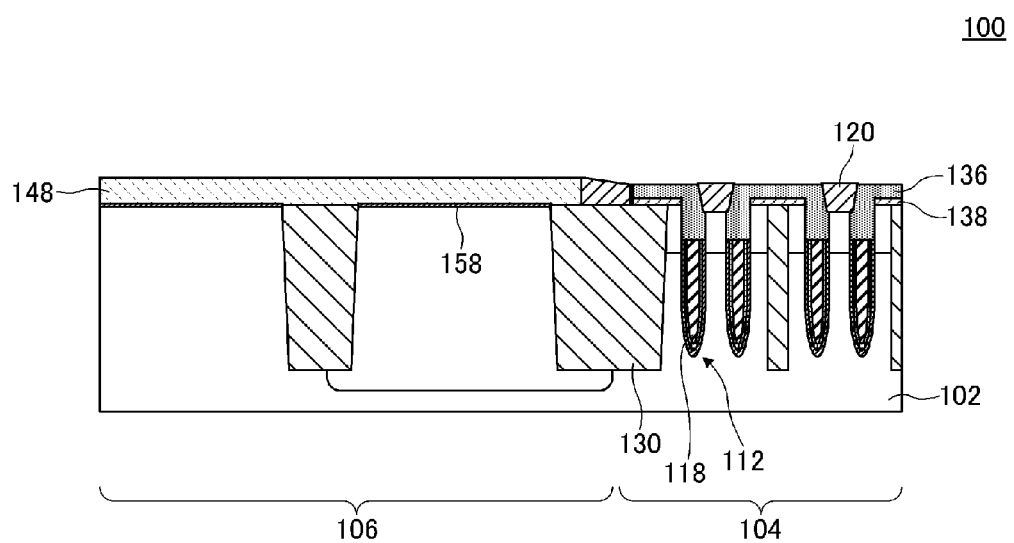
FIG. 16 is a cross-sectional view of an intermediate fabrication process step (12th step) of the semiconductor device shown in FIG. 1.

This silicon film (bit contact 120) is etched back until the first insulating layer 136 has been exposed. At this time, the cap insulating film 162 is also removed (FIG. 16). Thus, the bit contact 120 is formed on a trench-type transistor in the first region 104.

Figure 17:
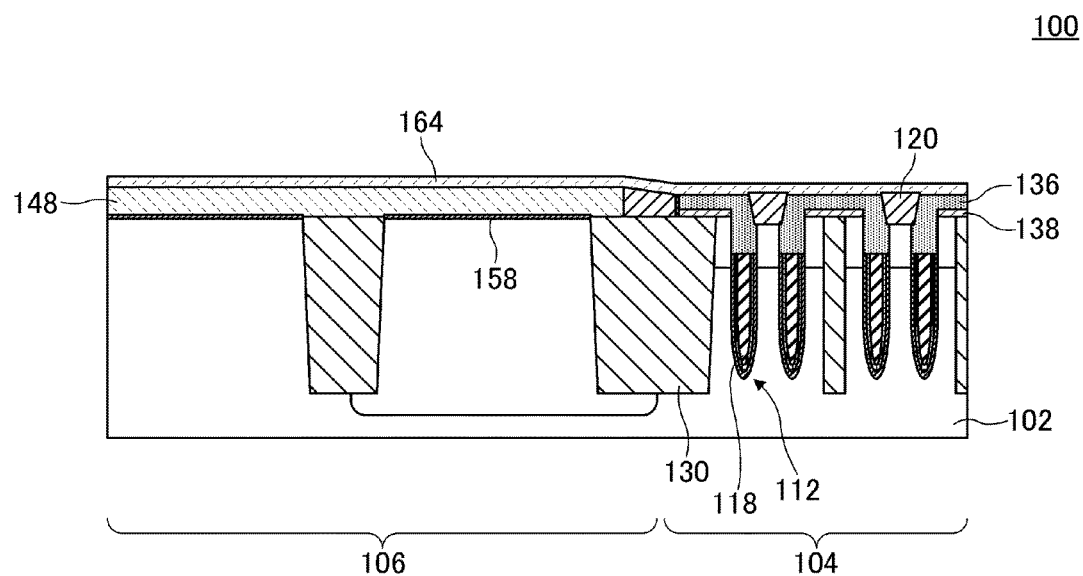
FIG. 17 is a cross-sectional view of an intermediate fabrication process step (13th step) of the semiconductor device shown in FIG. 1.
Figure 18:
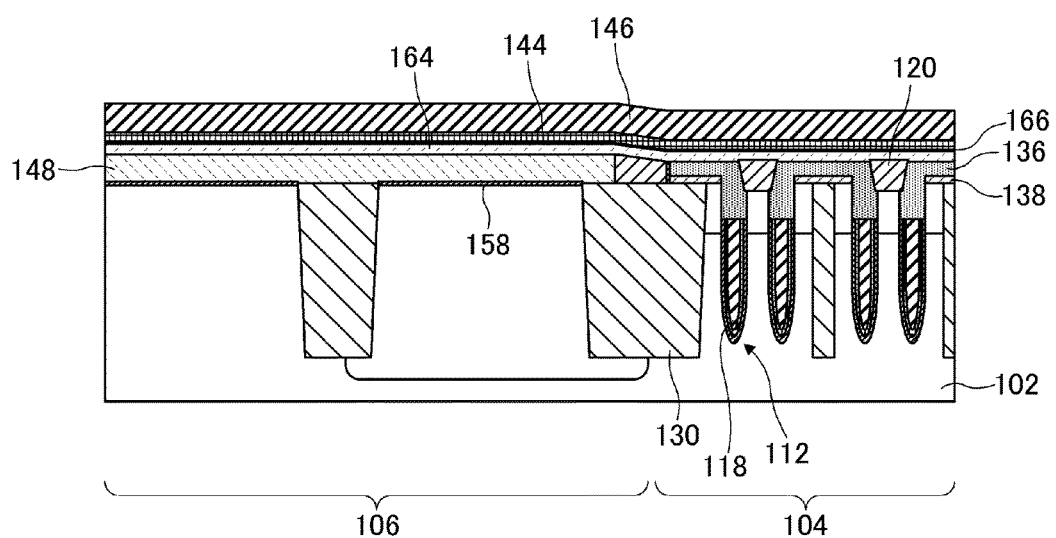
FIG. 18 is a cross-sectional view of an intermediate fabrication process step (14th step) of the semiconductor device shown in FIG. 1.

Next, the bit line 124 is formed. First, an amorphous silicon film 164 is thinly formed on the bit contact 120, the first insulating layer 136, and the amorphous silicon layer 148. The thickness of the amorphous silicon film 164 is preferably set to about 3 nm (FIG. 17). Moreover, a titanium film 166 is formed thereon by a PVD method with a thickness of about 2 nm, and a barrier metal layer 144 (TiN) and a metal wiring layer 146 (W) are formed successively thereon by a PVD method (FIG. 18).

Figure 19:
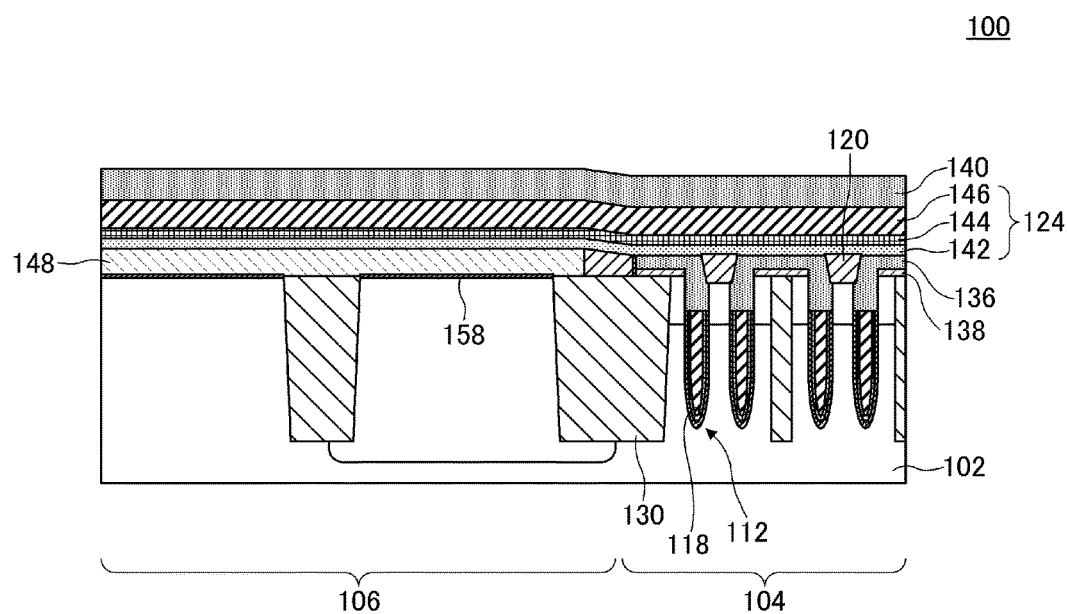
FIG. 19 is a cross-sectional view of an intermediate fabrication process step (15th step) of the semiconductor device shown in FIG. 1.

Thereafter, when a rapid thermal annealing (RTA) process is carried out thereon at about 850 degrees, the amorphous silicon film 164 and the titanium film 166 are reacted with each other so that a metal silicide layer 142 ($TiSi_2$) is formed (FIG. 19). In this case, the film thicknesses to be formed are desirably adjusted so as to allow almost all the amorphous silicon film 164 to react with the titanium film 142 to be converted to the metal silicide layer 142. Thus, the bit line 124 on which the metal silicide layer 142, the barrier metal layer 144 and the metal wiring layer 146 have been stacked is formed. A nitride film 140 is formed on the bit line 124. Thus, both of the metal silicide layers 142 for the trench-transistor Tr1 and planar-transistor Tr2 can be formed through the same process.

Figure 20:
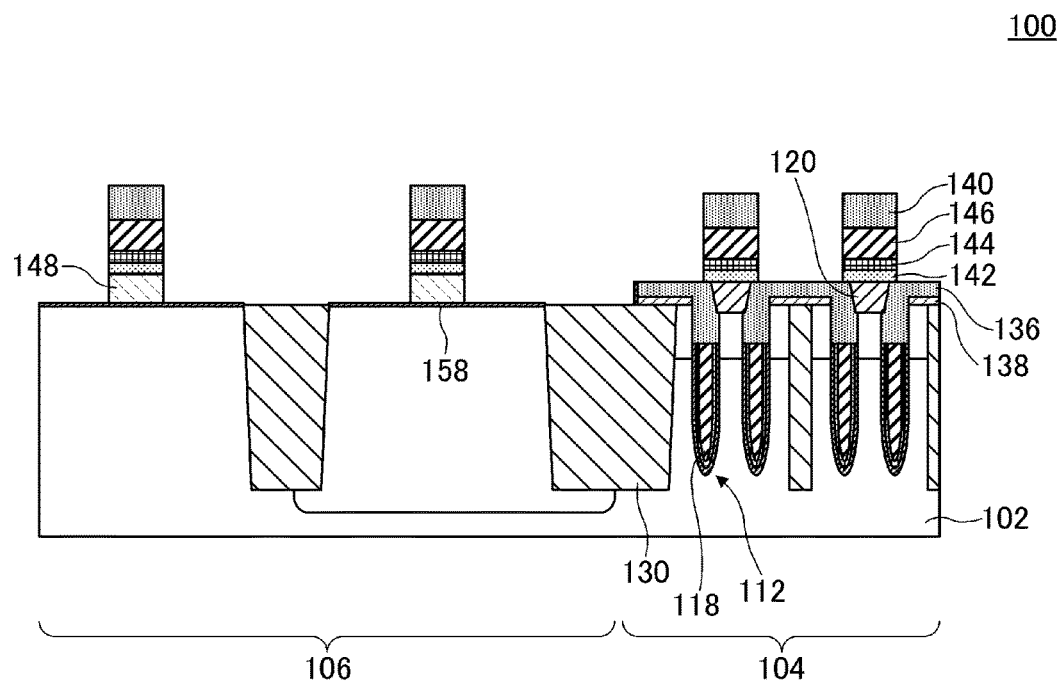
FIG. 20 is a cross-sectional view of an intermediate fabrication process step (16th step) of the semiconductor device shown in FIG. 1.

Next, by a dry etching process using a hard mask, a bit line 124 of the first region 104 and a gate electrode of the second region 106 are formed (FIG. 20). In this case, in the first region 104, the nitride film 140 (SiN), the metal wiring layer 146 (W), the barrier metal layer 144 (TiN) and the metal silicide layer 142 ($TiSi_2$) are stacked, and in the second region 106, the nitride film 140 (SiN), the metal wiring layer 146 (W), the barrier metal layer 144 (TiN) and the silicon layer 148 (polysilicon) are stacked.

Figure 21:
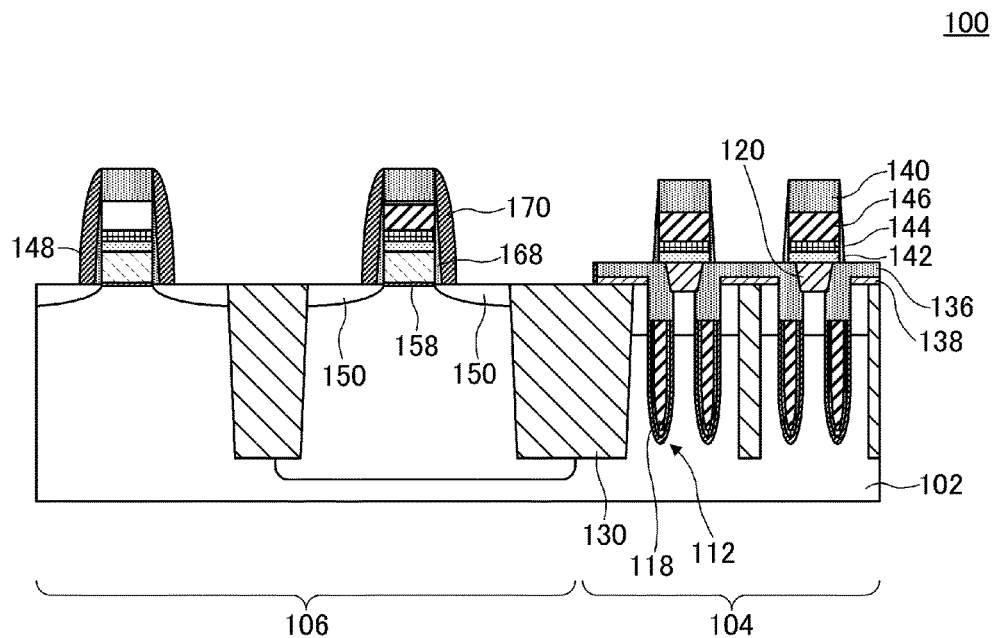
FIG. 21 is a cross-sectional view of an intermediate fabrication process step (17th step) of the semiconductor device shown in FIG. 1.

Since processes to be carried out thereafter relate to applications of well-known technologies, the explanation thereof will be given briefly. First, a silicon nitride film 168 is formed on the entire surface of the semiconductor substrate 102 by a CVD method (FIG. 21). By carrying out an etchback process on the silicon nitride film 168, this film is left on a side wall of a gate electrode. After removing the gate insulating film 158 on the third diffusion layer 150, an ion implanting process is carried out onto the third diffusion layer 150. Moreover, a silicon nitride film 170 is formed by a CVD method, and this is formed into a side wall by using the etchback process in the same manner.

Figure 22:
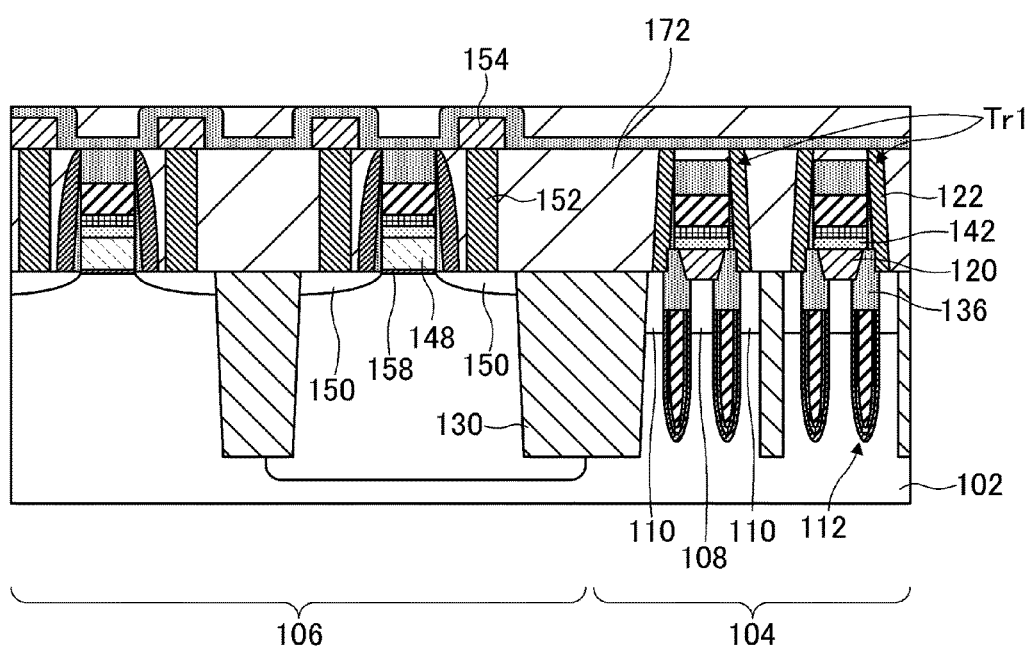
FIG. 22 is a cross-sectional view of an intermediate fabrication process step (18th step) of the semiconductor device shown in FIG. 1.

Thereafter, respective gate electrodes are covered with an interlayer insulating film 172 so that storage contacts 122 and contact plugs 152 are formed therein (FIG. 22). The third diffusion layer 150 is connected to the wiring layer 154 through the contact plugs 152 on the upper layer. Then, as shown in FIG. 1, by further forming the storage element 126, the plug 132, the upper wiring 134 and the like successively on the upper layer, the complete structure of the semiconductor device 100 is formed.

Figure 23:
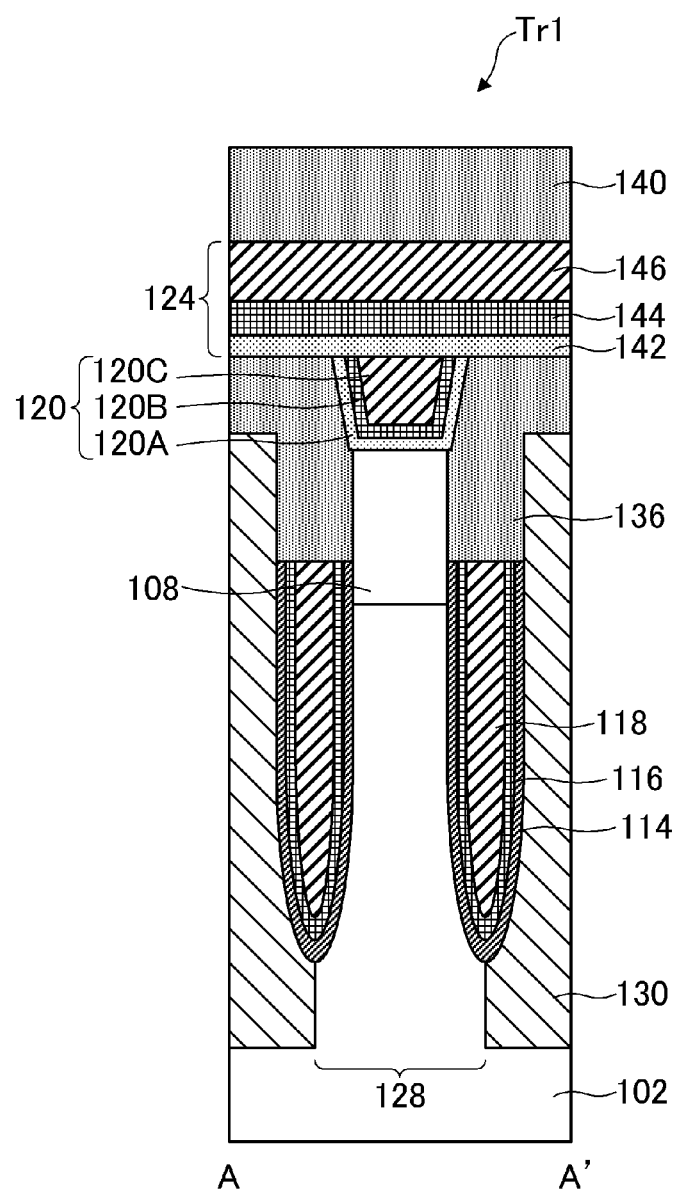
FIG. 23 is an expanded cross-sectional view of another embodiment of the FIG. 2 along the line A-A'.

FIG. 23 is an expanded cross-sectional view showing a structure of a semiconductor device of a second embodiment, which corresponds to a cross section taken along the line A-A' of FIG. 2.

As shown in FIG. 23, the semiconductor device in accordance with the second embodiment of the present invention differs from the semiconductor device of the aforementioned first embodiment in that the bit contact 120 is made of a metal plug. Since structures other than this are the same as those of the first embodiment, the same components are indicated by the same reference numerals, and the overlapped explanations will be omitted.

In the present embodiment, the bit contact 120 is comprised by a metal silicide film 120A composed of metal silicide such as titanium silicide ($TiSi_2$) or the like, a barrier metal layer 120B composed of titanium nitride (TiN) or the like and a metal layer 120C composed of metal such as tungsten (W). Each of the metal silicide film 120A and the barrier metal layer 120B has a cup shape, and the metal layer 120C forms the center portion of the contact plug so as to bury the cup. In this manner, by forming the bit contact 120 with a metal material, it becomes possible not only to lower the resistance value of the bit contact 120 itself, but also to lower the interface resistance between the bit line 124 and the bit contact 120.

The following description will explain a fabricating method of the bit contact 120 shown in FIG. 23.

First, after forming an opening for the bit contact 120 by carrying out processes as shown in FIG. 14, a thin silicon liner film is formed on the surface by using, for example, a CVD method. The film thickness of the silicon liner film is, for example, 3 nm. In this case, the silicon liner film may be doped with phosphorus. Thereafter, titanium (Ti), titanium nitride (TiN) and tungsten (W) are deposited thereon in this order. Next, after removing surplus silicon liner film, titanium (Ti), titanium nitride (TiN) and tungsten (W) formed on the upper surface of the first insulating layer 136 by using a CMP method or the like, the silicon liner film and titanium (Ti) are reacted with each other by a thermal treatment. Thus, a metal silicide film 120A made of titanium silicide (TiSi$_2$) is formed. Moreover, the titanium nitride (TiN) and tungsten (W) remaining in the opening are respectively formed into a barrier metal layer 120B and a metal layer 120C.

In this case, it is not essential to allow all the silicon liner film and titanium (Ti) to react with each other by the thermal treatment, and one portion of the silicon liner film may remain inside the opening. In this case, the surface of the opening, that is, the bottom and side face of the bit contact 120, is composed of unreacted silicon so that a silicon layer is interposed between the metal silicide layer 120A and the first insulating layer 136.

Thus, preferred embodiments of the invention have been described; however, the present invention is not intended to be limited only by the above-mentioned embodiments, and it is needless to say that various modifications may be made therein within a scope not departing from the gist of the present invention and those modifications are included within the scope of the present invention.

I claim:

1. A device comprising:
   a substrate;
   a contact plug disposed on the substrate and being a bit contact;
   an interlayer dielectric over the substrate to define the contact plug;
   wherein the contact plug comprises:
      a bottom portion facing to the substrate;
      a side portion being adjacent to the interlayer dielectric;
      a metal silicide comprising a cup shape that extends along the bottom and the side portions of the contact plug, the metal silicide along the bottom of the contact plug being against a diffusion region of the substrate;
      a metal nitride liner covering an inner surface of the cup shape of the metal silicide; and
      a metal plug disposed in an inner portion of the metal nitride liner;
   a bit line which includes titanium silicide extending continuously from an upper portion of the contact plug to over the interlayer dielectric, the titanium silicide of the bit line being over and in contact with each of the metal silicide, the metal nitride liner, and the metal plug of the contact plug; and
   a conductive material disposed over the titanium silicide.

2. The device according to claim 1, further comprising silicon layer between the metal silicide and the interlayer dielectric.

3. The device according to claim 1, further comprising:
   a groove being located in the substrate; and
   a word line disposed in a lower portion of the groove, wherein the interlayer dielectric is disposed in an upper portion of the groove and protrudes from an upper surface of the substrate.

4. The device according to claim 3, further comprising:
   an isolation region in the substrate;
   an active region surrounded by the isolation region in the substrate; and
   an additional groove prolonging in parallel with the groove, the groove and the additional groove each intersecting the active region and each extending continuously from the active region to the isolation region.

5. The device according to claim 4, wherein the word line extends continuously from the active region to the isolation region.

6. The device according to claim 5, further comprising:
   a field insulator covering the isolation region;
   a cell gate insulator covering an inner surface of the groove and extending continuously from the active region to the isolation region, the word, line covering the cell gate insulator.

7. A device comprising:
   a substrate;
   a bit line over the substrate and comprising titanium silicide; wherein the titanium silicide of the bit line comprises a first portion being located on a first conductive material that is in contact with the substrate, and comprises a second portion being located on an interlayer dielectric that is adjacent to the first conductive material; and
   wherein the first conductive material is a bit contact and comprises:
      a bottom portion facing the substrate;
      a side portion being adjacent to the interlayer dielectric;
      an additional metal silicide comprising a cup shape that surrounds the bottom and the side portions;
      a metal nitride material covering an inner surface of the cup shape; and
      a metal plug disposed in an inner portion of the metal nitride material, the titanium silicide of the bit line contacting each of the additional metal silicide, the metal nitride material, and the metal plug of the first conductive material.

8. A device comprising:
   a substrate;
   a first metal silicide comprising a cup shape including a bottom portion facing to the substrate;
   an interlayer dielectric surrounding an outer surface of the first metal silicide;
   a metal material disposed in an inner portion of the cup shape of the first metal silicide and being spaced from the first metal silicide by a metal nitride material, the first metal silicide, the metal nitride material and the metal material together being comprised by a bit contact; and
   a bit line containing a second metal silicide extending continuously on and directly contacting each of the respective upper portions of the interlayer dielectric, the first metal silicide, the metal nitride material and the metal material.

9. The device according to claim 8, wherein the first and second metal silicide each comprises one of an element in a group that consist of titanium, cobalt, nickel, and platinum.

10. The device according to claim 8, further comprising silicon layer between the first metal silicide and the interlayer dielectric.

* * * * *